United States Patent [19]
Ingraham et al.

[11] Patent Number: 6,061,245
[45] Date of Patent: May 9, 2000

[54] FREE STANDING, THREE DIMENSIONAL, MULTI-CHIP, CARRIER PACKAGE WITH AIR FLOW BAFFLE

[75] Inventors: Anthony P. Ingraham; Glenn L. Kehley, both of Endicott; Sanjeev B. Sathe, Johnson City; John R. Slack, Vestal, all of N.Y.

[73] Assignee: International Business Machines Corporation, Armonk, N.Y.

[21] Appl. No.: 09/010,667

[22] Filed: Jan. 22, 1998

[51] Int. Cl.[7] .................................. H05K 1/11; H05K 1/14
[52] U.S. Cl. .......................... 361/749; 361/690; 361/694; 361/753; 361/760; 361/772; 361/776; 361/777; 361/803; 174/254; 439/67; 439/77
[58] Field of Search .............................. 29/827, 830, 829; 174/117 FF, 250, 254, 268; 257/700, 701, 725, 735, 747; 361/688, 690, 694, 748, 695, 749, 752, 753, 760, 772, 774, 775, 776, 777, 783, 782, 784, 789, 790, 803; 439/67, 77, 82, 83

[56] References Cited

U.S. PATENT DOCUMENTS

| | | |
|---|---|---|
| 3,341,742 | 9/1967 | Klehm, Jr. ............................... 361/749 |
| 3,454,911 | 7/1969 | Rouzier et al. .......................... 361/749 |
| 4,426,689 | 1/1984 | Henle et al. ............................. 361/749 |
| 4,781,601 | 11/1988 | Kuhl et al. .............................. 361/749 |
| 5,179,501 | 1/1993 | Ocken et al. . |
| 5,220,488 | 6/1993 | Denes ...................................... 361/749 |
| 5,252,857 | 10/1993 | Kane et al. . |
| 5,345,205 | 9/1994 | Kornrumpf . |
| 5,382,829 | 1/1995 | Inoue . |
| 5,448,511 | 9/1995 | Paurus et al. ............................. 365/52 |
| 5,452,182 | 9/1995 | Eichelberger et al. ................. 361/749 |
| 5,519,578 | 5/1996 | Fujii . |
| 5,544,015 | 8/1996 | Akami . |
| 5,747,743 | 5/1998 | Kato et al. ............................. 174/254 |

FOREIGN PATENT DOCUMENTS

| | | | |
|---|---|---|---|
| 2844096 | 5/1979 | Germany ................................ 361/749 |
| 58-171689 | 10/1983 | Japan ..................................... 361/749 |
| 6-97621 | 4/1994 | Japan ........................................ 439/77 |

*Primary Examiner*—Leo P. Picard
*Assistant Examiner*—John B. Vigushin
*Attorney, Agent, or Firm*—Whitham, Curtis & Whitham

[57] ABSTRACT

An efficient cooling mechanism for a multi-chip carrier can be provided while conserving board surface area. Flexible circuitized material is used to form multi-chip carriers with air baffle capability. The flex is folded or curved into the desired shape and held in position with a support structure. Bonding sites for chips are located on regions through the carrier. Shapes which provide air baffle capabilities include coils, spring-like coils and serpentines.

14 Claims, 11 Drawing Sheets

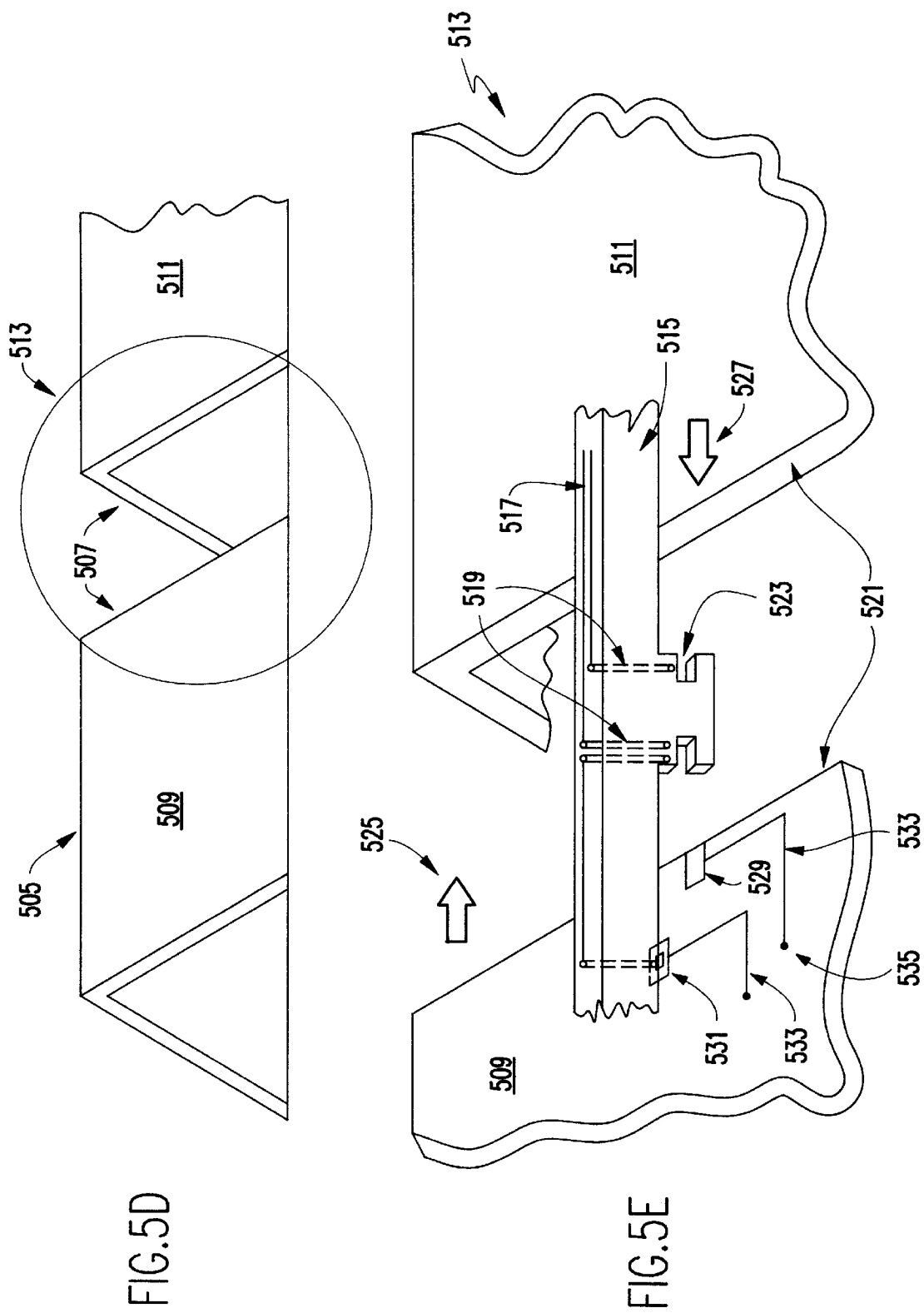

FREE STANDING, THREE DIMENSIONAL, MULTI-CHIP, CARRIER PACKAGE WITH AIR FLOW BAFFLE

BACKGROUND OF THE INVENTION

1. Field of the Invention

The present invention generally relates to multi-chip carriers and, more particularly, to carrier packages which provide for air flow in cooling electronic components.

2. Background Description

Chip carriers have been constructed with heat sinks to provide cooling for chips. However, the use of heat sinks takes up valuable space in a module package. In addition, chip and component carriers have been fabricated and packaged in a planar fashion which consumes valuable card or board surface area. The cooling of the components mounted on these carriers is limited to air flow across the horizontal plane on which the carrier is mounted. Vertical space is often reserved for some kind of heat fin or heat dissipating structure to radiate heat away from the components. Special off-substrate air directing channels or structures are often built within a computing machine to increase air flow efficiencies. This uses valuable space within the machine which could have been occupied by additional components, and results in lost opportunity in shrinking the overall size of the machine.

SUMMARY OF THE INVENTION

It is therefore an object of the present invention to provide a multi-chip package in a three dimensional structure that makes efficient use of space.

It is further an object to provide an air cooling baffle using a formed circuit carrier in various configurations to allow chips to run faster by cooling them efficiently.

The invention is a circuit carrier which is formed into a shape which provides mounting surfaces for chips, in horizontal, vertical and intermediate directions. The circuit carrier forms various air directing baffles which channel cooling air over and around the chips. A free standing structure is created which, when assembled with the support caps or bars, forms a multi-chip module. This module can be tested in advance prior to mounting on a substrate, card or board. In the embodiment described with end-caps, air ports are designed into the end-caps which provide air inlet flow to the formed circuit carrier baffle. These end-caps can be circuitized and have contact pads which mate to pads on the circuit carrier. Various bonding schemes can be used such as soft gold, solder, or conducting adhesive to ensure good electrical contact is made. The circuitry on the end caps provides short communication paths within the module structure without having to make the signal pass through to the substrate and back again to another chip. The assembly sequence can be as follows: solder mount chips to circuitized carrier, form carrier into desired shape, and assemble end caps or spacer frames (support bars). The package is then tested as a unit and later mounted to the substrate/card.

The preferred embodiment of the circuit carrier is one made from a flexible material such as PTFE or polyimide which would facilitate forming the structures described herein. Although the discussion is primarily directed to a flexible circuit, semi-rigid or rigid material molded or formed into the desired shapes could also be used as cost and situation dictate for a given packaging solution.

BRIEF DESCRIPTION OF THE DRAWINGS

The foregoing and other objects, aspects and advantages will be better understood from the following detailed description of a preferred embodiment of the invention with reference to the drawings, in which:

FIGS. 5D and 5E are enlarged isometric views of a portion of the triangular shaped carrier of FIGS. 5B and 5C showing how a circuitized support bar can be used make intra-module connection in addition to the circuit traces on the flexible substrate;

DETAILED DESCRIPTION OF PREFERRED EMBODIMENTS OF THE INVENTION

Figure 1:
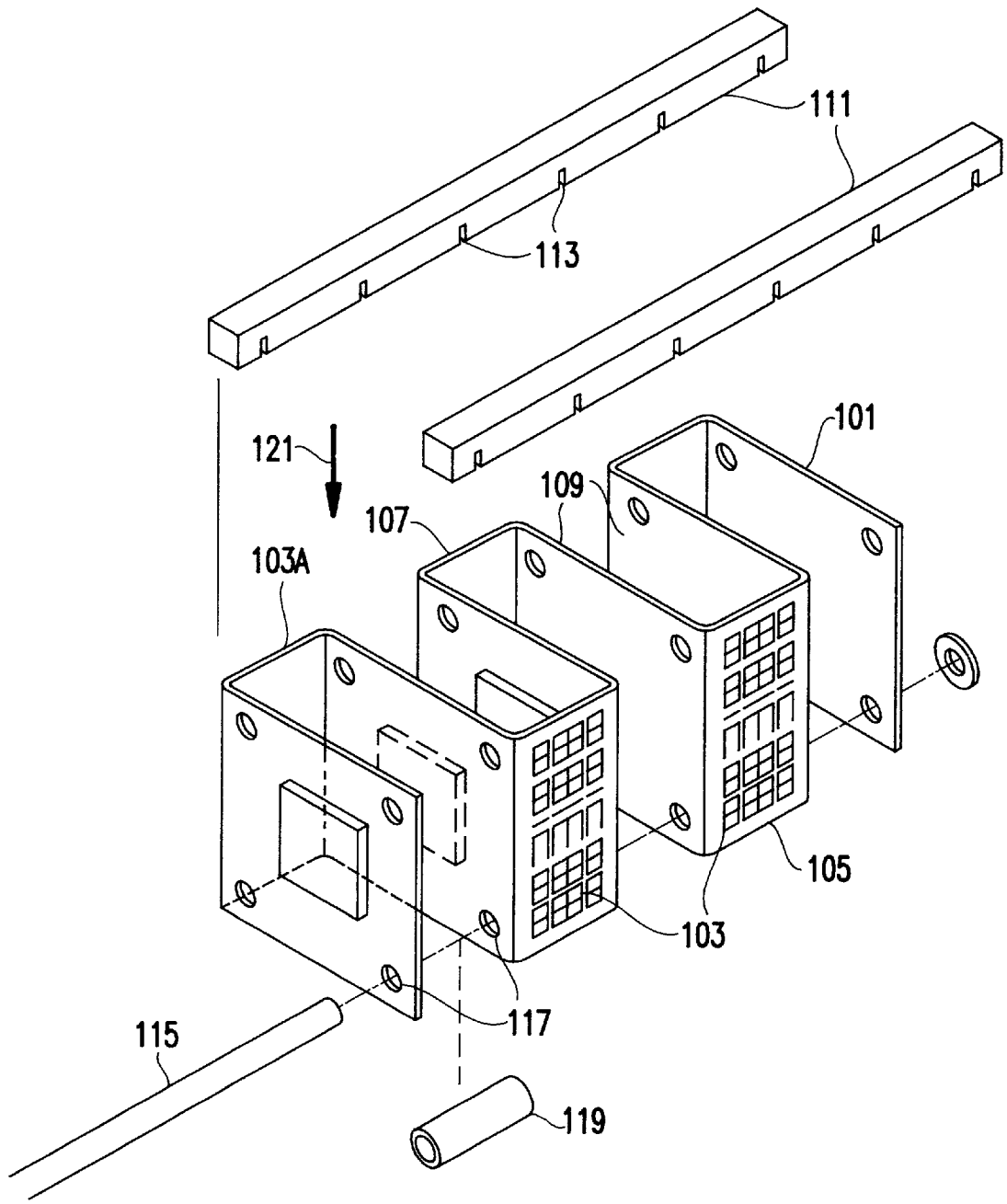
FIG. 1 is an exploded isometric view of the inventive chip carrier having a serpentine configuration.

Referring now to the drawings, and more particularly to FIG. 1, there is shown one embodiment of the inventive chip carrier in which the flexible carrier 101 is formed in a serpentine shape. The serpentine shape of the carrier in this figure forms multiple rectangles or squares. Contact pads, in the example illustrated, dendritic pads 103, are located on the outer edges of folds of the flexible carrier 101 for mounting other components or mounting the module to a substrate. Dendritic pad connection sites may also be placed in flat regions 109 between edges 105 and 107 for component mounting.

Additionally, these contact pads may be surface component mounting contact pads, flex circuit contact pads, or flex to substrate contact pads. The outer surface of the opposite side of the serpentine, identified in FIG. 1 as 103A, can be used for mounting other substrates, circuit boards, modules or chips to form a sandwich type structure with the serpentine structure in the middle of the resultant structure.

Two methods are shown here for holding the serpentine shape of the structure. One method may be to use two spacer frame pillars or bar members 111 on each side of the flexible carrier 101. These bar members 111 have notches 113 which fit each layer of folded flexible carrier. Notches 113 are shown perpendicular to the length of bar member 111; however, in another configuration, the notches of a support bar member 111 may be parallel or at an angle between perpendicular and parallel to the length of the pillar. A second method is to use rods and spacers. Rods 115 slide through holes 117 at each corner of a layer of folded flexible carrier. Between each hole, the rod 115 slides through spacers 119 which hold the distance between two folds. Other methods could be used to maintain the serpentine shape without departing from the spirit of the invention. Air flow 121 passes through the layers between each fold of flexible carrier 101 in this configuration.

Figure 1A:
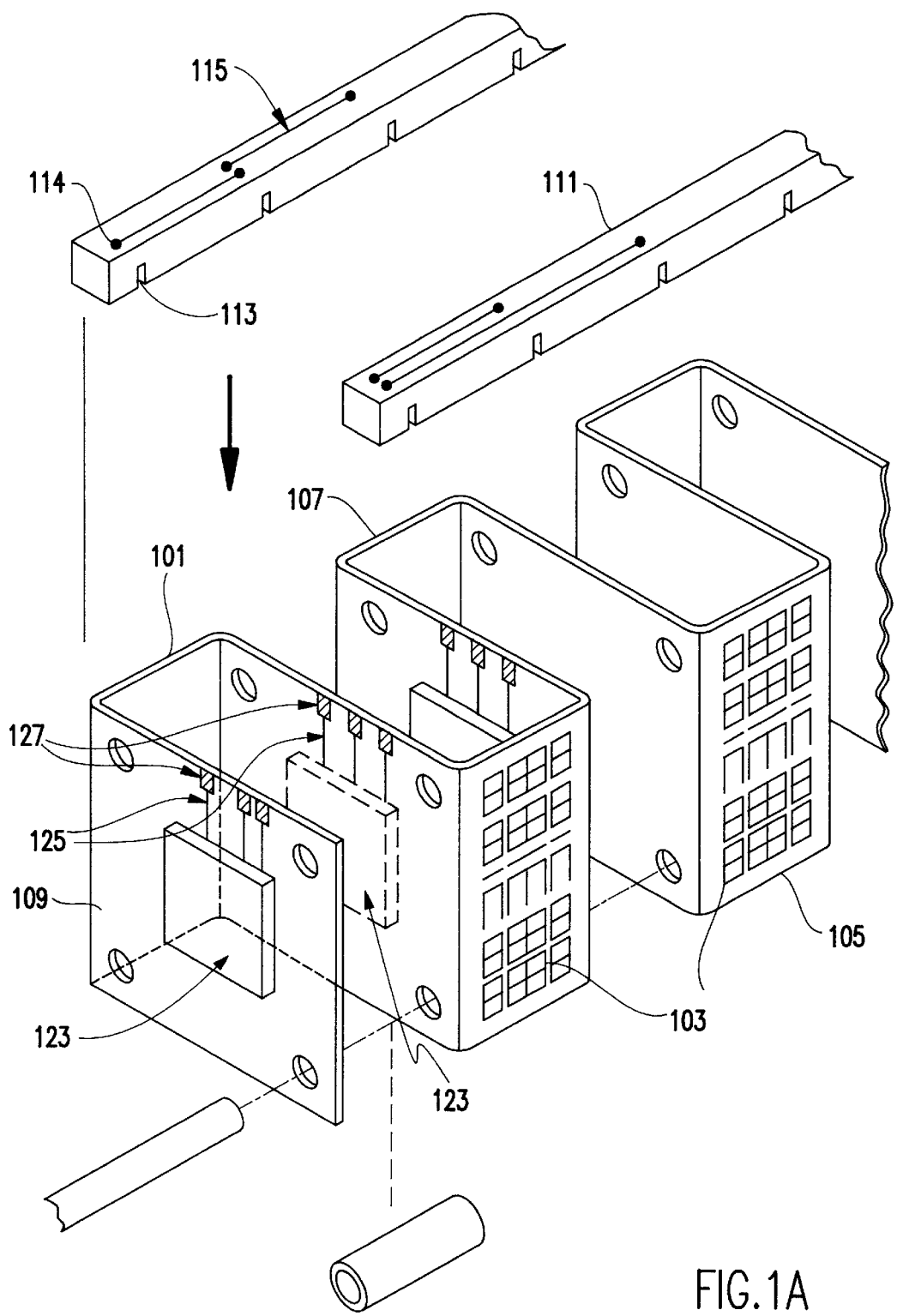
FIG. 1A is an enlargement of the chip carrier shown in FIG. 1, showing an edge connection method to the circuitized spacer frames for intra-module electrical communication paths.

In addition to that which is described above, FIG. 1A shows the folded flexible carrier 101 having mounted chips 123 on flat regions 109. The preferred method of mounting the chips 123 is by means of surface mount pads; however, other mounting techniques may be used, including plated through holes for pin component mounting. Circuit lines 125 lead from mounted chips 123 to edge pads 127. Pads 127 engage into slots 113 of bar members 111 which have contacts 114 within the slots, making electrical connection to traces 115 on the bar members. Circuit lines need not be confined to one surface of the flexible carrier 101, and circuitry on opposite surfaces may be interconnected by plated through holes.

Figure 2A:
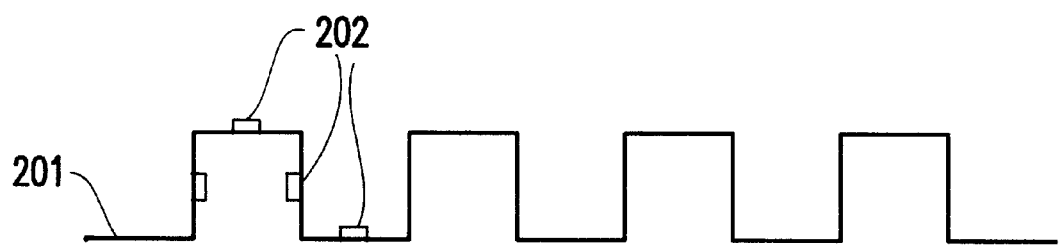
FIGS. 2A, 2B and 2C are cross-sectional views of possible serpentine configurations which may be used in the practice of the invention.
Figure 2B:
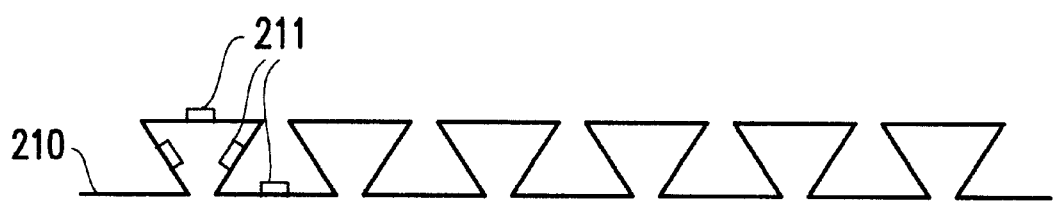
Figure 2C:
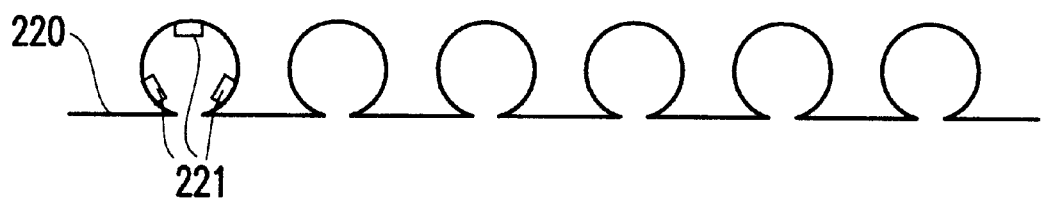

FIGS. 2A, 2B and 2C show three alternatives which may be used to create a serpentine flexible chip carrier. FIG. 2A shows the pattern formed for a square shape. This is similar to that which is shown in FIG. 1. Chips 202 may be connected to flexible carrier 201 at any position of a fold.

A trapezoidal serpentine structure is shown in FIG. 2B. Again, chips 211 may be connected to flexible carrier 210 at any position of a fold. A series of circular arcs forming a serpentine structure is shown in FIG. 2C. Chips 221 are connected to pads placed along the arcs of the flexible carrier 220. The chips could be on the outside, inside, or both opposing sides.

Figure 3A:
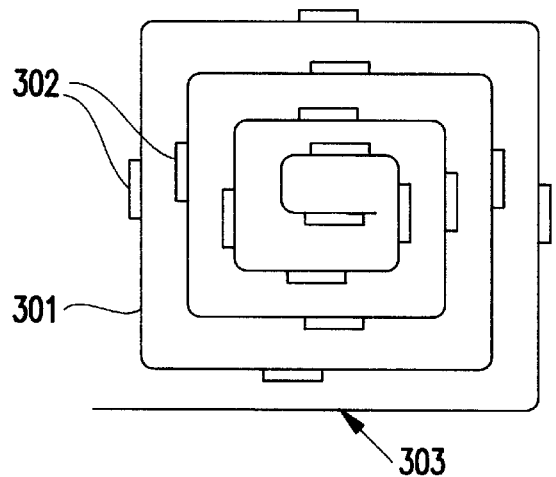
FIGS. 3A is a plan view and FIGS. 3B and 3C are isometric views showing respectively the inventive chip carrier in a coil configuration, an end cap to accommodate the coil, and an assembled module.
Figure 3B:
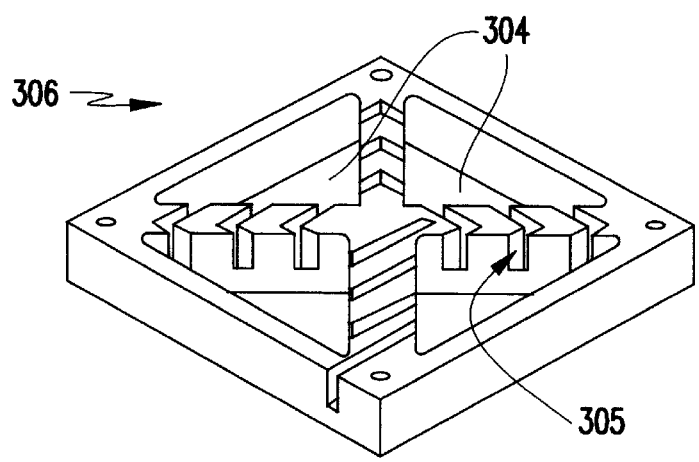
Figure 3C:
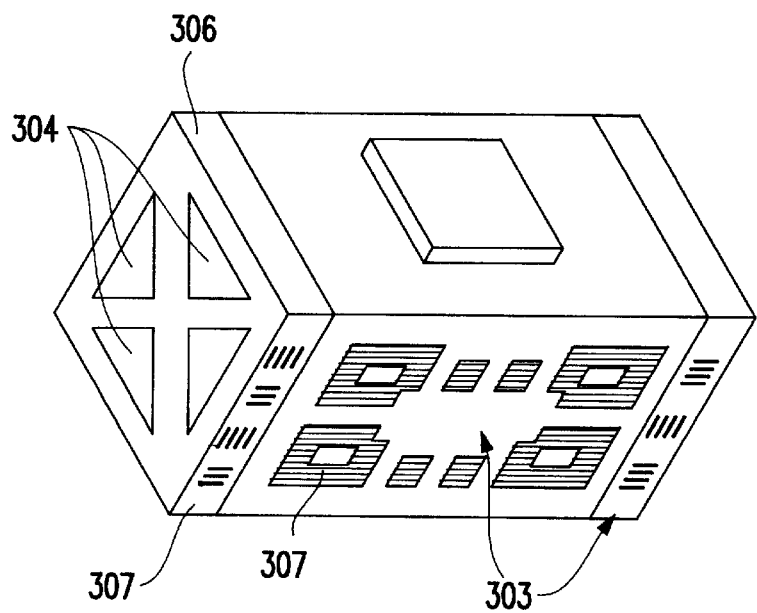

FIGS. 3A, 3B and 3C show a second alternative embodiment of the inventive chip carrier in which the flexible carrier 301 is formed in a rectangular coil shape. FIG. 3A shows a plan view of the rectangular coil where one can see that chips 302 may be mounted on all sides of each rectangle in the coil. One outer surface 303 is kept free for mounting to a card substrate, circuit board, chip pads of a large chip, or another module. The coil is held in position by an end cap 306 which is shown in FIG. 3B. The end cap 306 has holes 304 which allow for the flow of air through the coil. In addition, slots 305 hold each rectangle in the coil in position.

FIG. 3C shows the completed structure comprising the coil with end caps 306. The end caps can be circuitized and have contacts put within the slots 305 similar to that featured in the bar members 111, described with reference to FIGS. 1 and 1A. Contact pads 309 can also be put on the end cap 306 for optional connection and mounting to a circuit board. The base surface is shown having dendritic pads 307 for mounting. Other methods for mounting such as gold pads, solder balls and conductive metal paste, could also be used.

Figure 4A:
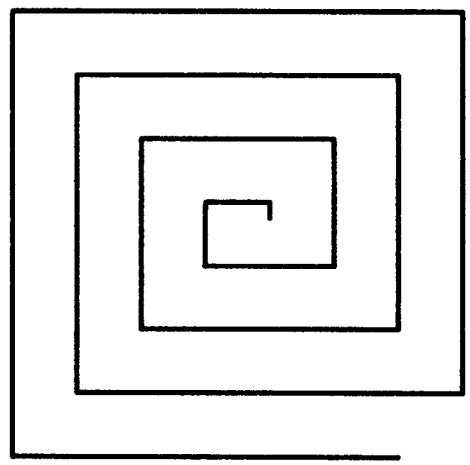
FIGS. 4A and 4B are plan views showing examples of other possible coil configurations.
Figure 4B:
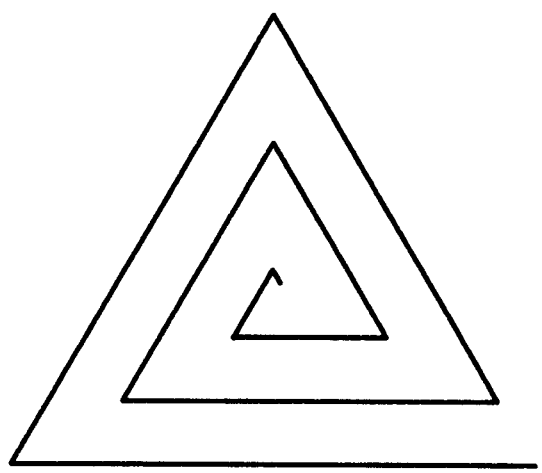

FIGS. 4A and 4B show two possible configurations for coils. In FIG. 4A a square coil is shown. In FIG. 4B a triangular coil is shown. Coils are possible in many polygon and circular shapes, as well.

Figure 5A:
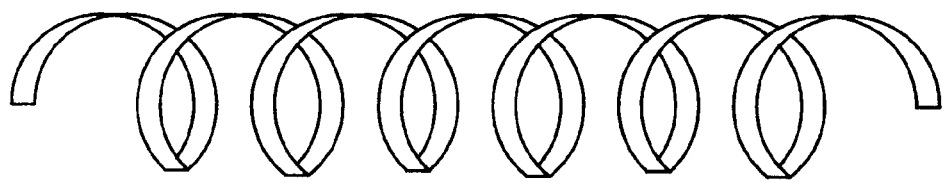
FIG. 5A is an elevation view of the inventive chip carrier in a spring-like coil configuration.

FIG. 5A shows a configuration where the flexible circuitized substrate is formed into a projecting coil, like a coil spring. This figure shows the coil in a smooth continuous bend forming a cylindrical projection.

Figure 5B:
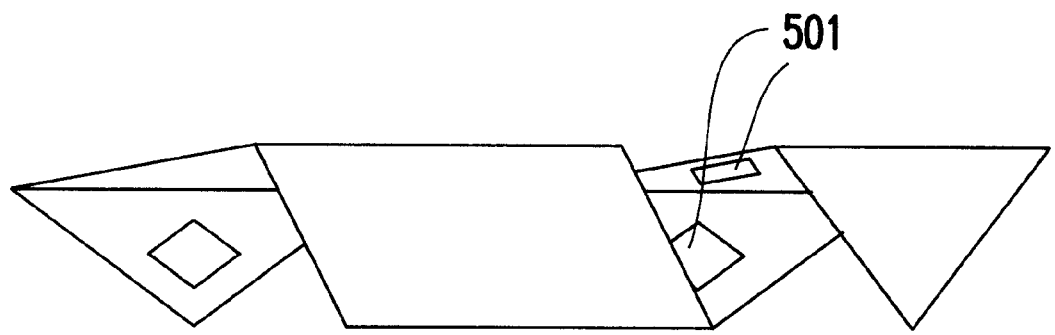
FIGS. 5B and 5C are, respectively, an isometric view and a plan view of a triangular shaped carrier according to the invention.

FIG. 5B illustrates a similarly coiled projection but based on a triangular shape. Components 501 are mounted on the inside of the spring-like coil but could also be mounted on the outside as well to form a free standing electronic component module.

Figure 5C:
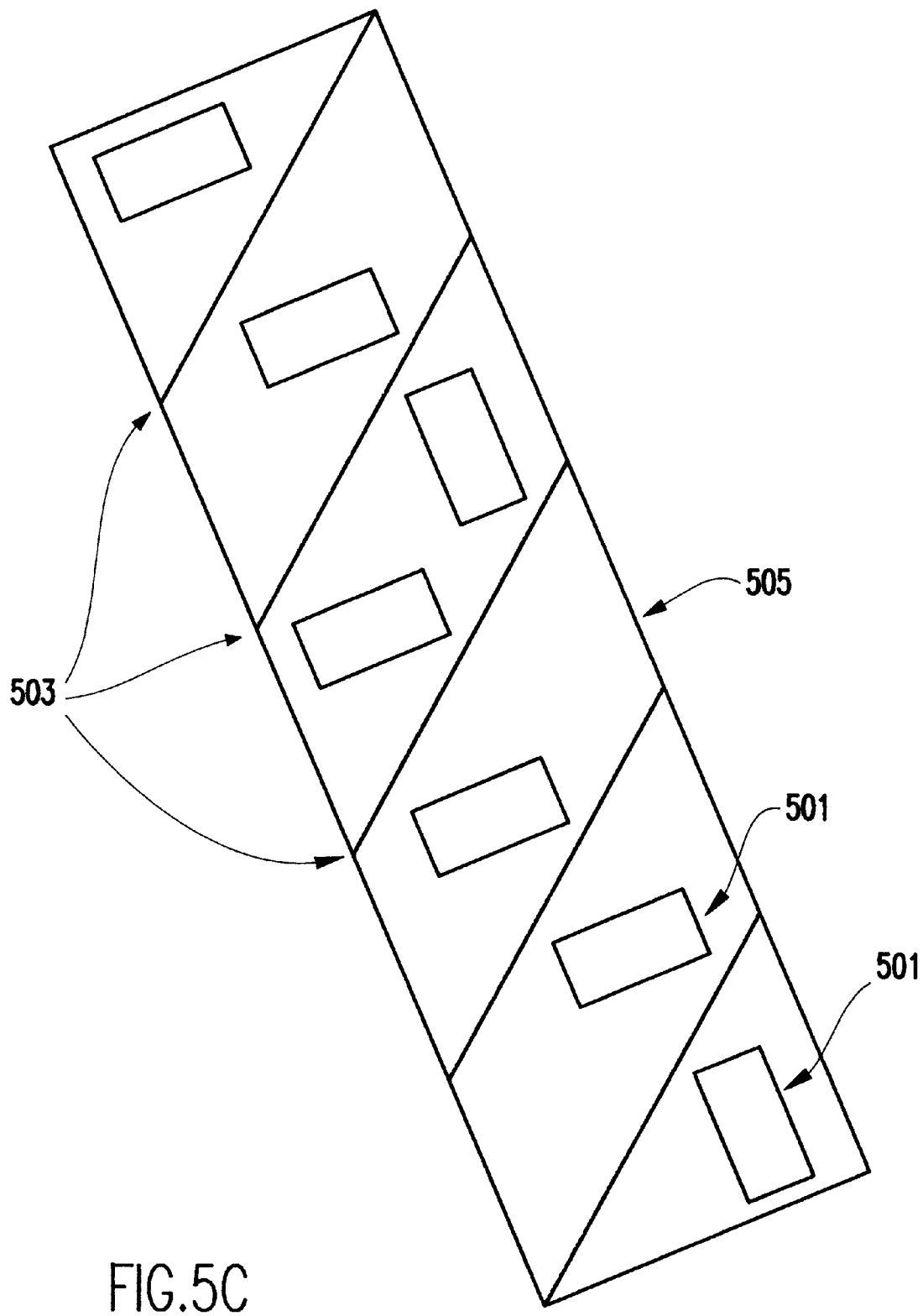

FIG. 5C shows the coil projection shown in FIG. 5B but laid out flat. The fold lines 503 are where the flexible, circuitized substrate 505 can be bent or folded to create the triangular coil projection. Components 501 are surface mount soldered on one or both sides. The flexible substrate is then folded along the fold lines 503 as shown in the FIG. 5C to form the structure of FIG. 5B.

FIG. 5D shows an enlarged view of the gap 507 between two triangular segments 509 and 511 of the spring-like coiled form of FIG. 5B. Area 513 is shown in more detail in FIG. 5E.

FIG. 5E shows an embodiment of how a circuitized support bar 515 can be used make intramodule connection in addition to the circuit traces on the flexible substrate. This is an extension of the bar member shown in FIG. 1 as element 111. The support bar 515 has circuitized traces 517 which connect to plated thru holes or pins 519. The edges 521 of the flexible circuit slide into the notches 523 of the support bar in the directions shown by arrows 525 and 527. The electrical contact pads 529 make an electrical contact with the notch metallurgy. The notch metallurgy can take many forms, one of which shown as an example, is the pin 519 which protrudes out from the top surface of the notch to wipe the pad 529. Surface pad 531 is shown as an example, is the pin 519 which protrudes out from the top surface of the notch to wipe the pad 529. Surface pad 531 is shown as an example of how the support bar could be electrically connected to the central regions of the flexible circuit. The connection could be made by such methods as conductive adhesive, solder reflow, mechanical compression, and dendrites on pin to surface pad. The circuitized flexible carrier will also have traces 533 connecting to contact pads 529 and surface pads 531. Plated through holes 535 may connect traces 533 to circuitry, pads, or components on the other side of flexible carrier. The bar 515 can extend the full length of the coil projection and intersect with end caps, similarly shown in FIG. 3C.

The advantage of creating different shapes and folds with the chip carrier is not only that space may be used in a more efficient manner, but that once mounted the shapes may direct air flow help efficiently cool an entire module. Many different chip carriers can be constructed out of flexible material and connected to one another and mounted on more flexible carriers or a solid substrate if desired to create an entire module.

The feature of having the support members such as the spacer bars and end caps circuitized with contacts to connect to the flexible circuit provides for additional communication paths within the module. These electrical connection paths are shorter length circuits which allow a particular chip to communicate with another chip mounted on the flexible circuit over and above those circuits which are available on or within the circuitized flexible carrier. The circuitized end caps or spacer bars could also be used to make the primary connection of the constructed module to a substrate, card, or board, as in element 309 in FIG. 3C.

Plated or deposited conductive dendrites on various pads on the flexible circuit allow for non-solder, detachable module mounting capability.

Figure 6:
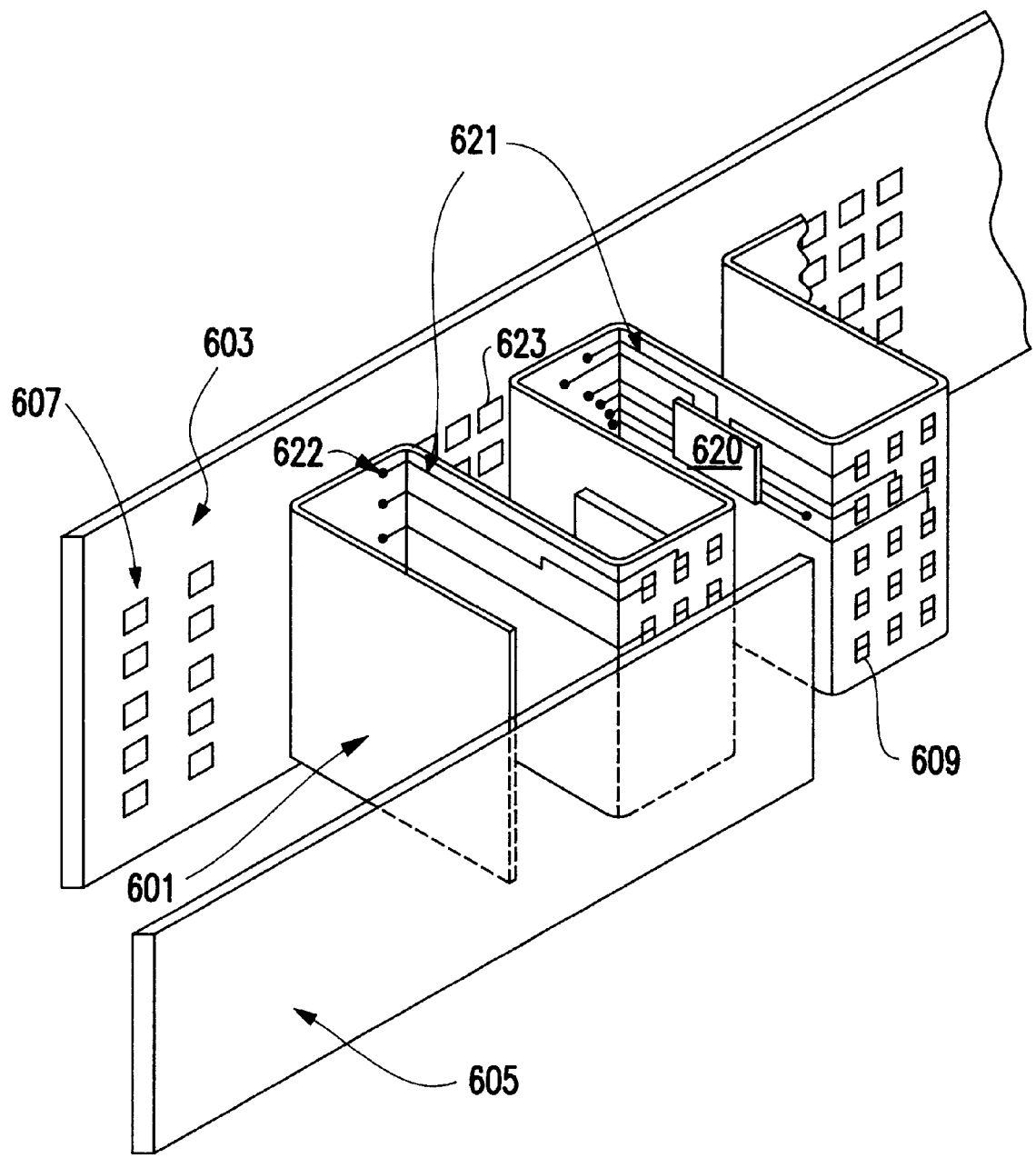
FIG. 6 is an isometric view of a portion of the inventive chip carrier mounted on two interfaces forming a combination surface mount connector, air flow baffle, and module (flexible substrate with components mounted on it) between two said interfaces.

By putting connection pads on opposite flat surfaces of the serpentine construction the circuitized flexible carrier may be mounted to two or more substrates, cards or boards to act as a combination module and connector between the two said substrates. In FIG. 6, there is shown a serpentine configuration of the inventive chip carrier 601 mounted on a substrate 603 and having a second substrate 605 mounted to an opposite side of the serpentine structure. Contact pads 607 are shown on the first substrate 603, contact pads 609 are also shown on the circuitized flexible carrier 601. Although not shown, the second substrate 605 may have contact pads as well.

Traces 621 lead to components 620 and contact pads 609 on opposite sides of the serpentine. Contact from one side of the serpentine flexible substrate to the other is made by plated through holes 622. The structure thus formed is a connector between substrates 605 and 603. By virtue of the fact that the serpentine shape allows for some flexure, the connector form can adjust for variations in stresses created between the two substrates, as the overall system goes through various thermal cycles. The structure 601 is a free standing electrical module with components 620 mounted on the spanning surfaces of the serpentine. The structure is also an air baffle which directs air between the two substrates and over the mounted component(s) 620, and any components that may be mounted on the substrate between the legs of the serpentine on contact pads 623.

Figure 7A:
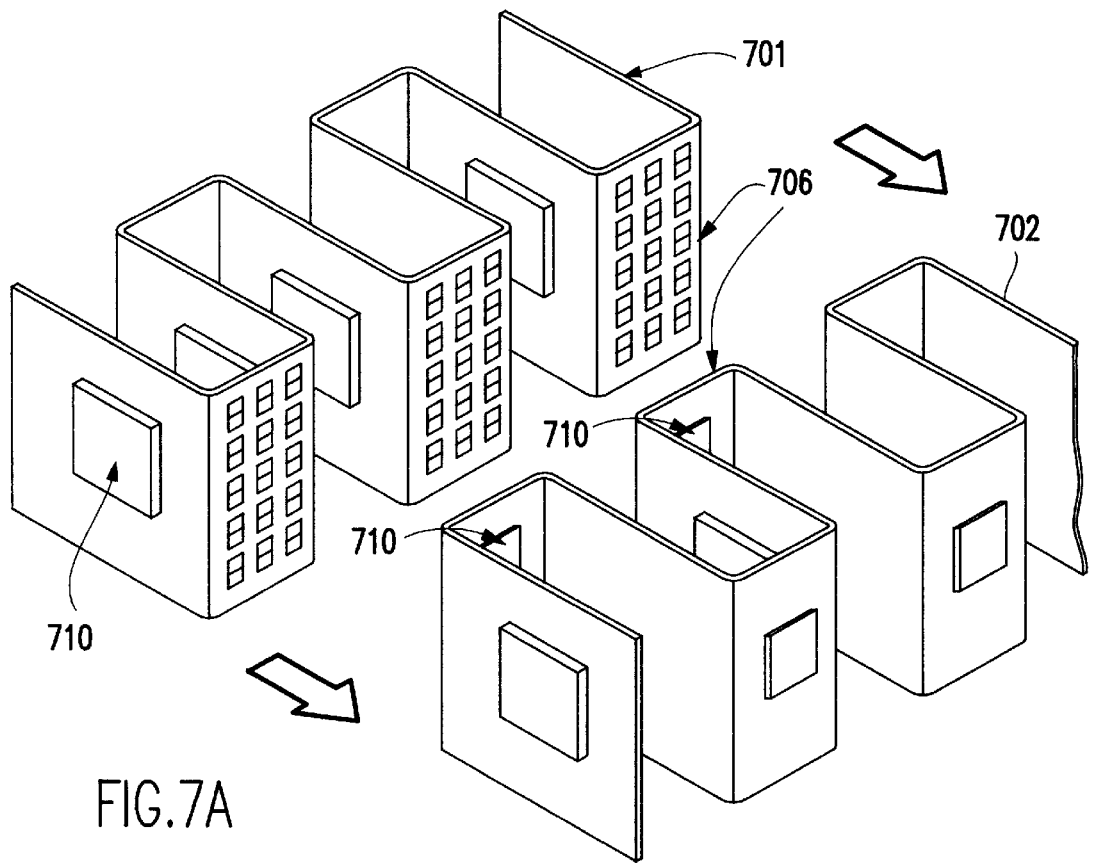
FIGS. 7A and 7B are isometric views showing the use of individual building blocks, in this case two serpentine elements, to create more complex free standing air flow directing channel structures which are circuit packaging modules.
Figure 7B:
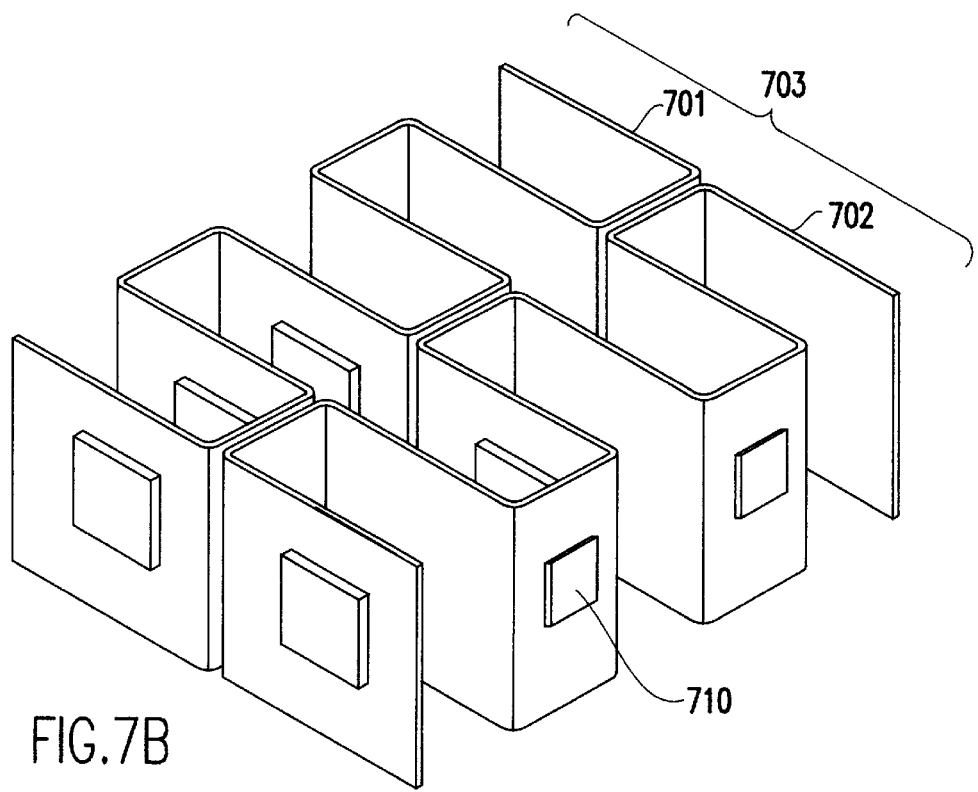
Figure 7C:
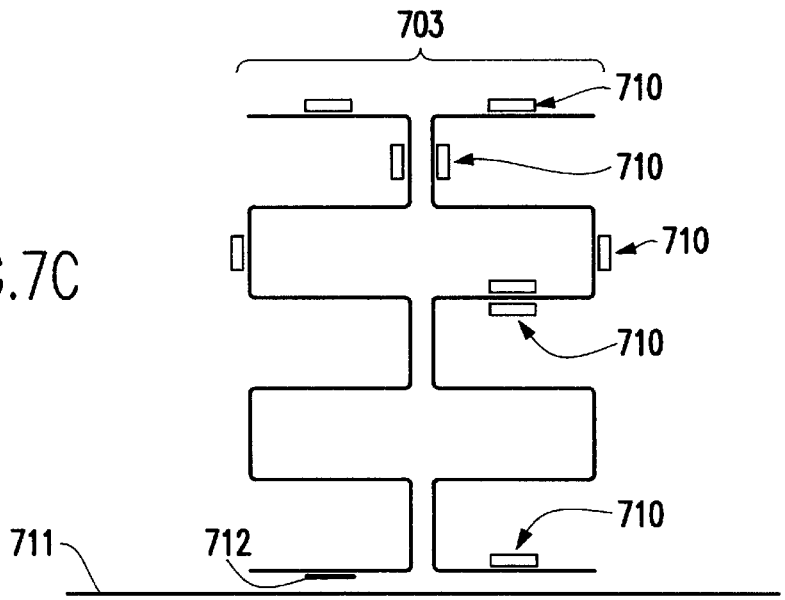
FIG. 7C is a plan view showing the structure formed by the combination of two serpentine elements as shown in FIGS. 7A and 7B.

FIGS. 7A, 7B and 7C show how basic building blocks such as a serpentine module, can be joined to form more complicated three dimensional structures. In FIG. 7A, prior to joining, serpentine structure 701 and serpentine structure 702 are lined up to match contact pads 706. Serpentine structure 701 is joined to serpentine structure 702 through the contact pads 706 to form structure 703, as shown in FIGS. 7B and 7C. The contact pads 706 could have various metallurgies such as dendrites of palladium or solder over copper nickel plating, for example. The structure 703 viewed on end, as shown in FIG. 7C, can be mounted to a substrate 711 along mounting surfaces 712. End caps were not shown here for simplicity. Chips 710 can be mounted on any surface not directly need for interconnection.

Figure 8:
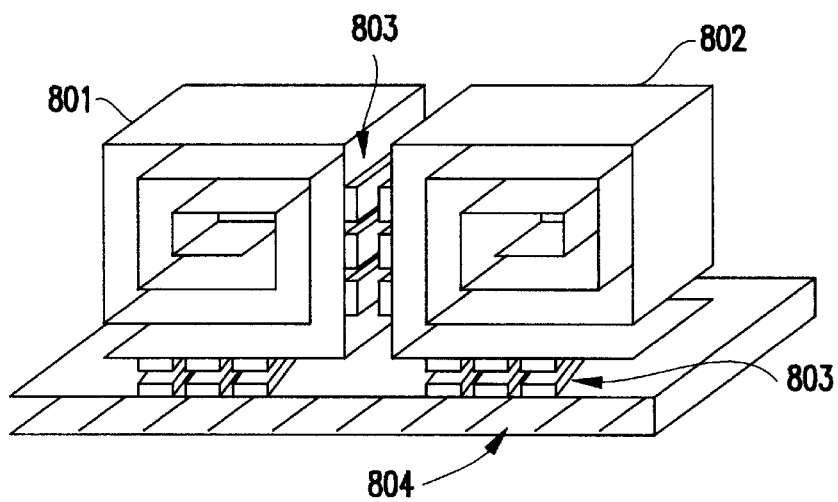
FIG. 8 is an isometric view showing yet another example of building up more complex structures, in this case, two coils are attached together and mounted on a substrate.

FIG. 8 shows an example of another building block combining two coils to form an intricate module shape with built in air flow channels. Coil module unit 801 is attached to coil unit 802 by mounting pads 803 located on their common surfaces. These in turn are joined to substrate 804. End caps can be added for additional support and electrical communication paths.

Figure 9:
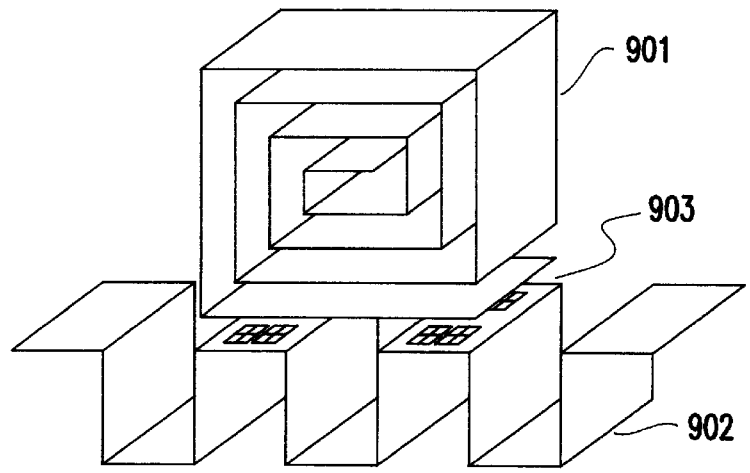
FIG. 9 is an isometric view showing the intermixing of structural elements to form additional complex three dimensional structures, in this case a coiled element is attached to a serpentine element.

FIG. 9 shows a spring-like coil module 901 joined along a section 903 of serpentine unit 902 to form yet another three dimensional shape.

While the invention has been described in terms of several preferred embodiments, those skilled in the art will recognize that the invention can be practiced with modification within the spirit and scope of the appended claims. As previously mentioned, the invention is not limited to flexible circuits, semi-rigid or rigid material molded or formed into the desired shapes could also be used as cost and situation dictate for a given packaging solution.

We claim:
1. A circuitized chip carrier comprising:
   a circuitized substrate composed of a flexible material formed into a predetermined shape which functions as an air flow baffle;
   a means for holding said circuitized flexible material in the predetermined shape, wherein said means for holding is circuitized with a multiplicity of conductive pads;
   electronic component connection means on the circuitized substrate at locations that expose connected electronic components to cooling air passing through the air flow baffle; and
   interconnection pads on the circuitized substrate for connecting the circuitized substrate to another substrate, module or other chip carrier.
2. A circuitized chip carrier as in claim 1, wherein said means for holding contains a multiplicity of electrical contacts.
3. A circuitized chip carrier as in claim 2, wherein said flexible material has a multiplicity of electrical connection pads to connect to said electrical contacts on said means for holding.
4. A circuitized chip carrier as in claim 3, wherein said means for holding has contact pads for mounting electrical components, chips, modules, substrates, or circuitized flexible material.
5. A circuitized chip carrier comprising:
   a circuitized substrate formed into a spring-like coil which functions as an air flow baffle;
   electronic component connection means on the circuitized substrate at locations that expose connected electronic components to cooling air passing through the air flow baffle; and
   interconnection pads on the circuitized substrate for connecting the circuitized substrate to another substrate, module or other chip carrier.
6. A circuitized chip carrier as in claim 5, wherein said spring-like coil is comprised of a series of geometric shapes selected from the group consisting of triangles, squares, polygons, or circles.
7. A circuitized chip carrier comprising:
   a circuitized substrate composed of a flexible material formed into a predetermined shape by a pair of slotted end caps having directional fluid flow openings which functions as an air flow baffle;
   electronic component connection means on the circuitized substrate at locations that expose connected electronic components to cooling passing through the air flow baffle; and
   interconnection pads on the circuitized substrate for connecting the circuitized substrate to another substrate, module or other chip carrier.
8. A method of attaching at least a first flexible circuit substrate to a second flexible circuit substrate, each said flexible circuit substrate including surface component mounting contact pads, flex circuit contact pads, and flex to substrate contact pads, said method comprising the steps of:
   attaching surface mount components to said first and second flexible circuit substrates;
   forming said first and second flexible circuit substrates into a three dimensional shape;
   attaching end caps at each end of said formed first and second flexible circuit substrates; and
   joining said flex circuit contact pads of said first flexible circuit substrate to said flex circuit contact pads of second flexible circuit substrate.

9. The method of claim 8 further including the step of:

attaching substrate contact pads of said joined first and second flexible circuit substrates to a circuit substrate.

10. The method of claim 9 wherein a conductive adhesive is used in attaching surface mount components to said first and second flexible circuit substrates, joining said flex circuit contact pads and attaching said substrate contact pads to said circuit substrate.

11. The method of claim 8 wherein in the forming step, said first and second flexible circuit substrates are folded over a cylindrical shape thereby preventing circuit line damage.

12. The method of claim 8 wherein in the forming step, said first and second flexible circuit substrates are folded to form serpentine structures.

13. The method of claim 8 wherein in the forming step, said first and second flexible circuit substrates are folded to form coiled structures.

14. The method of claim 8 wherein in the forming step, said first flexible circuit substrates is folded to form a coiled structure and said second first flexible circuit substrates is folded to form a serpentine structure.

\* \* \* \* \*